United States Patent
Arishima et al.

(10) Patent No.: US 12,289,548 B2
(45) Date of Patent: Apr. 29, 2025

(54) PIXEL ARRAY HAVING SEPARATE VOLTAGE SUPPLY LINES FOR PIXELS AND BIAS CIRCUITRY

(71) Applicant: CANON KABUSHIKI KAISHA, Tokyo (JP)

(72) Inventors: Yu Arishima, Kanagawa (JP); Koichiro Iwata, Kanagawa (JP); Hiroaki Kameyama, Kanagawa (JP); Masaki Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 18/173,218

(22) Filed: Feb. 23, 2023

(65) Prior Publication Data

US 2023/0276147 A1   Aug. 31, 2023

(30) Foreign Application Priority Data

Feb. 28, 2022   (JP) .............................. JP2022-030180

(51) Int. Cl.
*H04N 25/709* (2023.01)
*H04N 25/633* (2023.01)
*H04N 25/78* (2023.01)

(52) U.S. Cl.
CPC ......... *H04N 25/709* (2023.01); *H04N 25/633* (2023.01); *H04N 25/78* (2023.01)

(58) Field of Classification Search
None
See application file for complete search history.

(56) References Cited

U.S. PATENT DOCUMENTS

| | | |
|---|---|---|
| 7,741,593 B2 | 6/2010 | Iwata |
| 7,755,688 B2 | 7/2010 | Hatano |
| 7,961,237 B2 | 6/2011 | Hatano |
| 8,106,343 B2 | 1/2012 | Arishima |
| 8,159,577 B2 | 4/2012 | Iwata |
| 8,355,066 B2 | 1/2013 | Iwata |
| 8,368,790 B2 | 2/2013 | Itano |
| 8,415,724 B2 | 4/2013 | Iwata |
| 8,466,401 B2 | 6/2013 | Arishima |
| 8,507,870 B2 | 8/2013 | Arishima |
| 8,530,989 B2 | 9/2013 | Kikuchi |
| 8,553,115 B2 | 10/2013 | Arishima |
| 8,598,901 B2 | 12/2013 | Hiyama |

(Continued)

FOREIGN PATENT DOCUMENTS

| | | |
|---|---|---|
| JP | 2021-150402 A | 9/2021 |
| JP | 2021-180435 A | 11/2021 |
| JP | 2022-023778 A | 2/2022 |

*Primary Examiner* — Paul M Berardesca
(74) *Attorney, Agent, or Firm* — Venable LLP

(57) ABSTRACT

A photoelectric conversion device includes a pixel array having aperture pixels arranged so as to form rows and columns, signal lines arranged in the pixel array so as to allow readout of signals from the aperture pixels, current sources connected to the signal lines, a first voltage supply line configured to supply a first reference voltage to the aperture pixels, a first pad connected to the first voltage supply line, a bias circuit configured to supply a bias voltage to the current sources, a second voltage supply line electrically separated from the first voltage supply line, and configured to supply a second reference voltage to the bias circuit, and a second pad connected to the second voltage supply line.

17 Claims, 14 Drawing Sheets

(56) References Cited

U.S. PATENT DOCUMENTS

| | | |
|---|---|---|
| 8,670,058 B2 | 3/2014 | Hayashi |
| 8,687,246 B2 | 4/2014 | Fujimura |
| 8,710,610 B2 | 4/2014 | Kono |
| 8,742,359 B2 | 6/2014 | Arishima |
| 8,796,609 B2 | 8/2014 | Arishima |
| 8,836,833 B2 | 9/2014 | Yamashita |
| 8,885,082 B2 | 11/2014 | Noda |
| 8,928,786 B2 | 1/2015 | Iwata |
| 9,118,857 B2 | 8/2015 | Iwata |
| 9,232,164 B2 | 1/2016 | Minowa |
| 9,276,036 B2 | 3/2016 | Arishima |
| 9,407,847 B2 | 8/2016 | Maehashi |
| 9,432,607 B2 | 8/2016 | Morita |
| 9,509,931 B2 | 11/2016 | Kobayashi |
| 9,549,139 B2 | 1/2017 | Ikeda |
| 9,602,753 B2 | 3/2017 | Saito |
| 9,716,823 B2 | 7/2017 | Iwata |
| 9,831,278 B2 | 11/2017 | Kato |
| 9,979,916 B2 | 5/2018 | Hiyama |
| 10,015,430 B2 | 7/2018 | Kobayashi |
| 10,319,765 B2 | 6/2019 | Kato |
| 10,554,913 B2 | 2/2020 | Arishima |
| 10,742,905 B2 | 8/2020 | Iwata |
| 10,992,886 B2 | 4/2021 | Yamazaki |
| 11,115,608 B2 | 9/2021 | Sakai |
| 11,265,501 B2 | 3/2022 | Iwata |
| 11,477,401 B2 | 10/2022 | Itano |
| 11,496,704 B2 | 11/2022 | Sato |
| 2009/0251576 A1* | 10/2009 | Hattori .......... H04N 25/76 348/294 |
| 2011/0278652 A1* | 11/2011 | Shima .......... H04N 25/673 257/291 |
| 2015/0109504 A1* | 4/2015 | Sakuragi ........ H01L 27/14634 257/459 |
| 2016/0014363 A1* | 1/2016 | Kito .......... H04N 25/78 348/308 |
| 2017/0264844 A1* | 9/2017 | Kamezawa ........ H04N 25/78 |
| 2021/0360180 A1 | 11/2021 | Saito et al. |
| 2022/0030164 A1 | 1/2022 | Kobayashi |
| 2022/0247956 A1* | 8/2022 | Kobayashi ........ H04N 25/78 |

* cited by examiner

PIXEL ARRAY HAVING SEPARATE VOLTAGE SUPPLY LINES FOR PIXELS AND BIAS CIRCUITRY

BACKGROUND OF THE INVENTION

Field of the Invention

The present invention relates to a photoelectric conversion device, a photoelectric conversion system, and a moving body.

Description of the Related Art

Japanese Patent Laid-Open No. 2021-180435 describes an image sensor that reduces image quality deterioration due to fluctuation of a reference voltage caused by incident light. The image sensor described in Japanese Patent Laid-Open No. 2021-180435 can include the first pad and the second pad. The first pad supplies, to pixels arranged in an aperture pixel region, a reference voltage supplied from the outside. The second pad supplies, to pixels arranged in a light-shielded pixel region, the reference voltage supplied from the outside.

With the arrangement described in Japanese Patent Laid-Open No. 2021-180435, if strong light enters the aperture pixel region, the voltage of a vertical signal line passing through the aperture pixel region fluctuates greatly, and this can cause the reference voltage to fluctuate. The fluctuation of the reference voltage causes fluctuation of a bias voltage which is supplied to a current source connected to each signal line, and this can cause a deterioration in image quality.

SUMMARY OF THE INVENTION

The present invention provides a technique advantageous in reducing fluctuation of a bias voltage caused by incident light.

One of aspects of the present invention provides a photoelectric conversion device comprising: a pixel array including a plurality of aperture pixels arranged so as to form a plurality of rows and a plurality of columns; a plurality of signal lines arranged in the pixel array so as to allow readout of signals from the plurality of aperture pixels; a plurality of current sources connected to the plurality of signal lines, respectively; a first voltage supply line configured to supply a first reference voltage to the plurality of aperture pixels; a first pad connected to the first voltage supply line; a bias circuit configured to supply a bias voltage to the plurality of current sources; a second voltage supply line electrically separated from the first voltage supply line, and configured to supply a second reference voltage to the bias circuit; and a second pad connected to the second voltage supply line.

Further features of the present invention will become apparent from the following description of exemplary embodiments with reference to the attached drawings.

DESCRIPTION OF THE EMBODIMENTS

Figure 1:
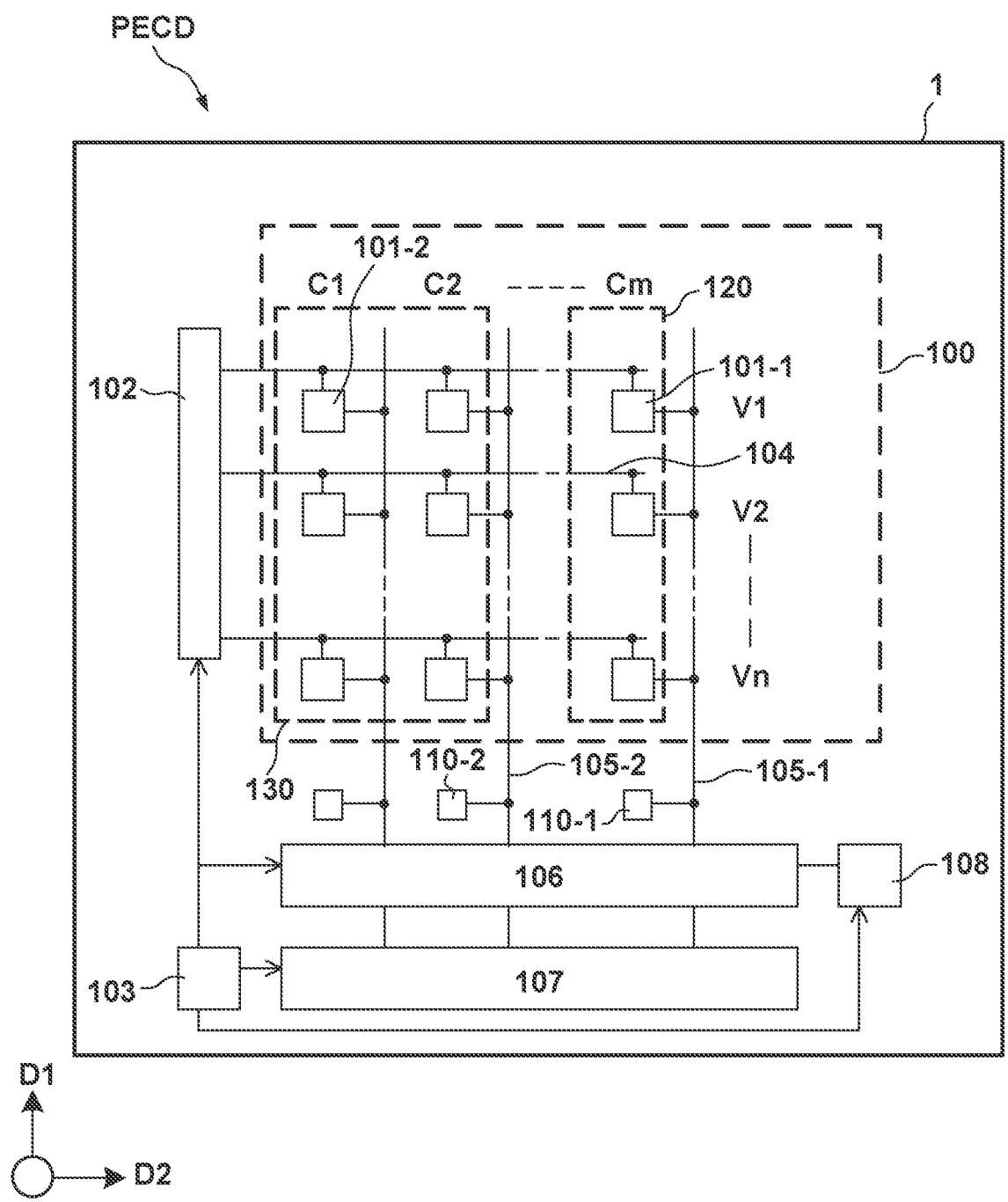
FIG. 1 is a view exemplarily showing the basic arrangement of a photoelectric conversion device according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 exemplarily shows the basic arrangement of a photoelectric conversion device PECD according to the first embodiment. For example, the photoelectric conversion device PECD can be formed as a solid-state image sensor or a device including a solid-state image sensor. The solid-state image sensor is, for example, a CMOS image sensor. A plurality of components forming the photoelectric conversion device PECD can be arranged on a semiconductor substrate 1. The photoelectric conversion device PECD includes a pixel array 100. The pixel array 100 includes a plurality of pixels 101 (101-1 and 101-2) arranged so as to form a plurality of rows (V1 to Vn) and a plurality of columns (C1 to Cm). A microlens and/or a color filter can be arranged on the pixel array 100.

The pixel array 100 includes an aperture pixel array 120. The aperture pixel array 120 includes a plurality of aperture pixels 101-1 arranged so as to form the plurality of rows (V1 to Vn) and multiple columns (C3 to Cm in the example shown in FIG. 1). Here, the plurality of rows are arranged in a first direction D1, and each row extends parallel to a second direction D2 crossing or orthogonal to the first direction D1. The multiple columns are arranged in the second direction D2, and each column extends parallel to the first direction D1.

The aperture pixel 101-1 is formed such that incident light entering the photoelectric conversion device PECD enters the photoelectric conversion element of the aperture pixel 101-1. In the aperture pixel 101-1, the light typically enters the photoelectric conversion element through an aperture provided in a light shielding film. The photoelectric conversion device PECD can include a plurality of vertical signal lines 105-1 (signal lines) arranged in the pixel array 100 so as to allow readout of signals from the plurality of aperture pixels 101-1. The aperture pixel 101-1 can be configured such that it can output, through the corresponding vertical signal line 105-1, a pixel signal corresponding to the amount of light having entered its photoelectric conversion element.

The pixel array 100 may further include a light-shielded pixel array 130. The light-shielded pixel array 130 includes a plurality of light-shielded pixels 101-2 arranged so as to form the plurality of rows (V1 to Vn) and one or multiple columns (C1 and C2 in the example shown in FIG. 1). The light-shielded pixel 101-2 includes a light shielding film that blocks incident light so the incident light entering the photoelectric conversion device PECD does not enter the photoelectric conversion element of the light-shielded pixel 101-2. The photoelectric conversion device PECD can include one or a plurality of second vertical signal lines 105-2 arranged in the pixel array 100 so as to allow readout of signals from the plurality of light-shielded pixels 101-2. The light-shielded pixel 101-2 can be configured such that it can output, through the corresponding second vertical signal line 105-2, a dark signal corresponding to the noise components generated and accumulated in its photoelectric conversion element. The light-shielded pixel array 130 can be arranged in a direction parallel to the second direction D2 when viewed from the aperture pixel array 120. Such the light-shielded pixel array 130 can form a horizontal optical black region. The light shielding film can be made of, for example, a metal material such as copper or aluminum. The pixel array 100 may include other pixels, for example, a dummy pixel that outputs no signal and/or a pixel for focus detection. In the following description, when expressing the vertical signal line 105-1 and the second vertical signal line 105-2 without distinguishing them from each other, they are referred to as vertical output lines 105.

The photoelectric conversion device PECD can include a vertical scanning circuit 102, a control circuit 103, a plurality of drive signal line groups 104, a plurality of the vertical output lines 105 (105-1 and 105-2), a readout circuit 106, a horizontal scanning circuit 107, and an output circuit 108. The vertical scanning circuit 102 receives a control pulse supplied from the control circuit 103, and generates a drive pulse for driving the pixels 101 in each row. The drive pulse is supplied to the pixels 101 in each row via the drive signal line group 104. Each drive signal line group 104 can include a plurality of drive signal lines. The vertical scanning circuit 102 can be understood as a circuit that generates a drive pulse for driving a readout circuit (in-pixel readout circuit) in the pixel 101 to read out a signal from the pixel 101.

The plurality of the vertical output lines 105 can include the plurality of vertical signal lines 105-1 and the one or the plurality of second vertical signal lines 105-2. The plurality of vertical signal lines 105-1 and the one or the plurality of second vertical signal lines 105-2 are connected to the readout circuit 106 (out-of-pixel readout circuit) arranged outside the pixel array 100. Note that in this specification, connection means electrical connection unless the context otherwise requires. A current source 110-1 can be connected to each of the plurality of vertical signal lines 105-1. A second current source 110-2 can be connected to each of the one or the plurality of second vertical signal lines 105-2. In the following description, when expressing the current source 110-1 and the current source 110-2 without distinguishing them from each other, they are referred to as current sources 110. The current source 110 can form a source follower circuit together with an amplification transistor of each pixel 101 to be described later.

The readout circuit 106 performs a process of reading out signals from the pixels 101 in the respective rows through the vertical output lines 105 (105-1 and 105-2). The readout circuit 106 can include, for example, a differential amplification circuit, a sample hold circuit, an AD conversion circuit, a memory, and the like. The differential amplification circuit can amplify a signal output from the pixel 101 in each row through the vertical output line 105. The sample hold circuit can sample and hold an output of the differential amplification circuit. The AD conversion circuit can AD-convert an output of the sample hold circuit. The memory can temporarily hold an output of the AD conversion circuit.

The horizontal scanning circuit 107 supplies, to the readout circuit 106, a transfer control signal for sequentially transferring multiple signals processed by the readout circuit 106 to the output circuit 108. The output circuit 108 outputs the signal transferred from the readout circuit 106 to a signal processor outside or inside the photoelectric conversion device PECD. The control circuit 103 generates a plurality of control signals for controlling operations of the vertical scanning circuit 102, the readout circuit 106, the horizontal scanning circuit 107, and the output circuit 108. At least one of the plurality of control signals may be supplied from the outside of the photoelectric conversion device PECD.

In the photoelectric conversion device PECD configured as described above, the dark signal obtained from each row in the light-shielded pixel array 130 can be used for, for example, a correction process of correcting a pixel signal obtained from the corresponding row in the aperture pixel array 120. The correction process may be performed inside or outside the photoelectric conversion device PECD. If the correction process is performed inside the photoelectric conversion device PECD, the photoelectric conversion device PECD includes a correction circuit for performing the correction process.

Figure 2:
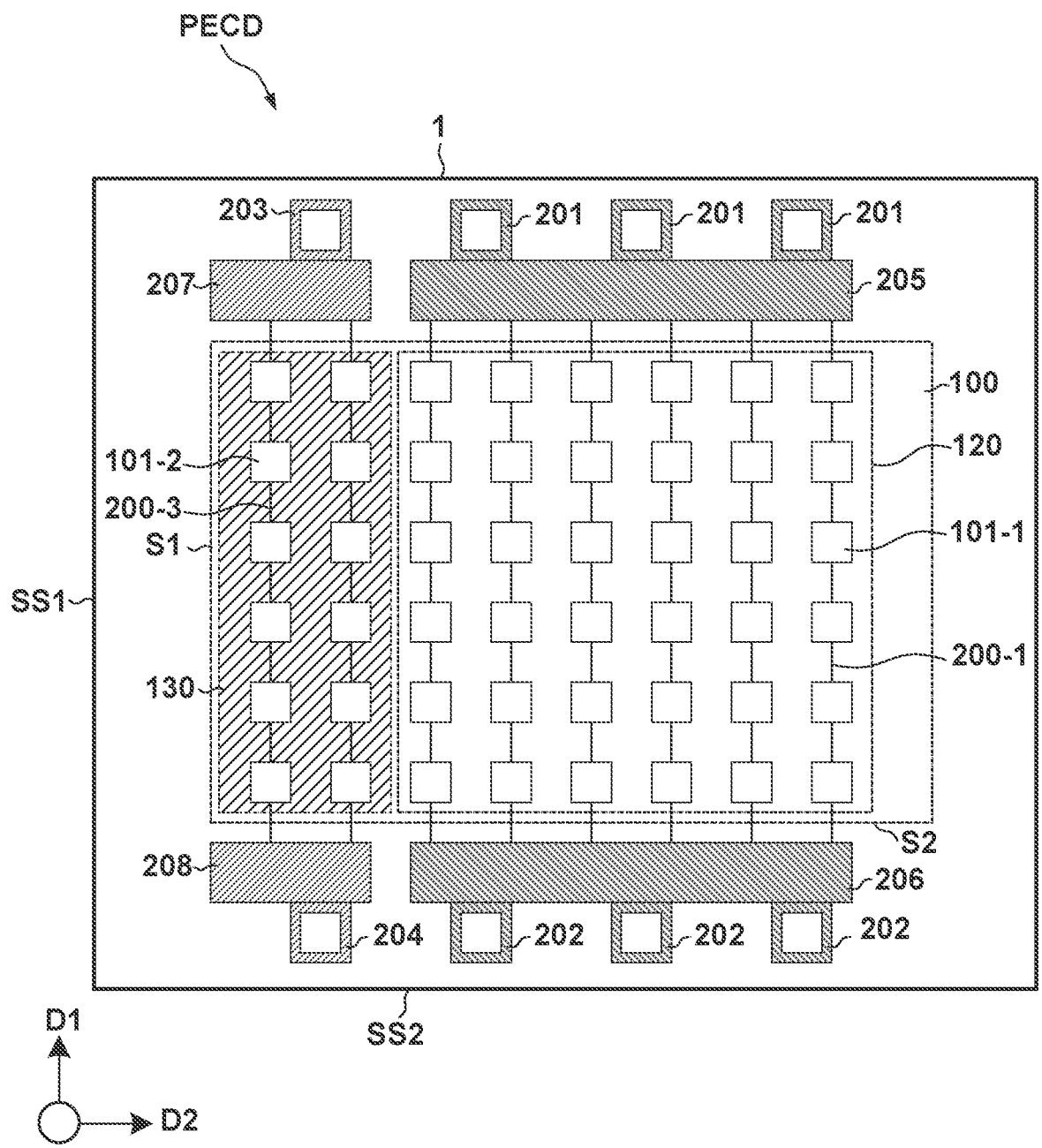
FIG. 2 is a view schematically showing a reference voltage distribution circuit in the photoelectric conversion device according to the first embodiment.

FIG. 2 schematically shows a reference voltage distribution circuit in the photoelectric conversion device PECD according to the first embodiment. The reference voltage is a voltage with a constant nominal value, and the concept of the reference value includes, for example, a ground voltage, a constant voltage higher than the ground voltage (for example, a positive power supply voltage), and a constant voltage lower than the ground voltage. The positive power supply voltage can be expressed as VDD. The nominal value means a voltage ignoring unintended fluctuations caused by noise, a parasitic resistance, or the like. An example in which the reference voltage is the positive power supply voltage will be described below, but the present invention is also applicable to a case in which the reference voltage is other than the positive power supply voltage.

In the example shown in FIG. 2, for the sake of descriptive convenience, the pixel array 100 includes the plurality of pixels 101 arranged so as to form six rows and eight columns. Further, the aperture pixel array 120 includes the multiple pixels 101 (more specifically, the aperture pixels 101-1) forming six rows and six columns, and the light-shielded pixel array 130 includes the multiple pixels 101 (more specifically, light-shielded pixels 101-2) forming six rows and two columns.

The photoelectric conversion device PECD can include a voltage supply line 200-1 (first voltage supply line) that supplies the first reference voltage (VDD) to the multiple aperture pixels 101-1, and pads 201 and 202 (first pads) connected to the voltage supply line 200-1 (first voltage supply line). The photoelectric conversion device PECD can also include a voltage supply line 200-3 (third voltage supply line) that supplies, to the multiple light-shielded pixels 101-2, the second reference voltage (VDD) having a nominal value equal to the nominal value of the first reference voltage (VDD). The photoelectric conversion device PECD can also include pads 203 and 204 (second pads) connected to the voltage supply line 200-3 (third voltage supply line). The voltage supply line 200-3 (third voltage supply line) is electrically separated from the voltage supply line 200-1 (first voltage supply line). The pads 203 and 204 (second pads) are electrically separated from the pads 201 and 202 (first pads), and arranged spaced apart from the pads 201 and 202 (first pads).

Each of the voltage supply lines 200-1 and 200-3 may be a conductive pattern arranged on the surface of the semiconductor substrate 1 via an insulating film, or may be an impurity semiconductor region such as a well in the semiconductor substrate 1. In the example shown in FIG. 2, one voltage supply line 200-1 (first voltage supply line) is provided for one column, but a plurality of the voltage supply lines 200-1 (first voltage supply lines) may be provided for one column. In this case, the plurality of the voltage supply lines 200-1 (first voltage supply lines) may have nominal values equal to each other, or may include at least two voltage supply lines having nominal values different from each other. Further, in the example shown in FIG. 2, one voltage supply line 200-3 (third voltage supply line) is provided for one column, but a plurality of the voltage supply lines 200-3 (third voltage supply lines) may be provided for one column. In this case, the plurality of the voltage supply lines 200-3 (third voltage supply lines) may have nominal values equal to each other, or may include at least two voltage supply lines having nominal values different from each other.

In the example shown in FIG. 2, when viewed from the pixel array 100, the pads 201 and 203 are arranged in the positive direction of the first direction D1, and the pads 202 and 204 are arranged in the negative direction of the first direction D1. Here, the pads 201 and 202 (first pads) are connected to both ends of a plurality of the voltage supply lines 200-1 for the aperture pixel array 120, and supply, to the plurality of aperture pixels 101-1, the first reference voltage (VDD) supplied from the outside of the semiconductor substrate 1. The pads 203 and 204 (second pads) are connected to both ends of the one or the plurality of voltage supply lines 200-3 for the light-shielded pixel array 130, and supply, to the plurality of light-shielded pixels 101-2, the second reference voltage (VDD) supplied from the outside of the semiconductor substrate 1.

The plurality of the voltage supply lines 200-1 for the aperture pixel array 120 can be connected by wiring patterns 205 and 206. A plurality of the pads 201 can be connected to each other by the wiring pattern 205. A plurality of the pads 202 can be connected to each other by the wiring pattern 206. The number of the pads 201 is an arbitrary number including one, and the number of the pads 202 is also an arbitrary number including one. The number of the pads 201 is preferably equal to the number of the pads 202. The wiring pattern 205 and the wiring pattern 206 preferably have the same structure.

The plurality of the voltage supply lines 200-3 for the light-shielded pixel array 130 can be connected by wiring patterns 207 and 208. A plurality of the pads 203 may be provided, and in this case, the plurality of the pads 203 can be connected by the wiring pattern 207. Similarly, a plurality of the pads 204 may be provided, and in this case, the plurality of the pads 204 can be connected by the wiring pattern 208. The number of the pads 203 is an arbitrary number including one, and the number of the pads 204 is an arbitrary number including one. The number of the pads 203 is preferably equal to the number of the pads 204. The wiring pattern 207 and the wiring pattern 208 preferably have the same structure.

Figure 3:
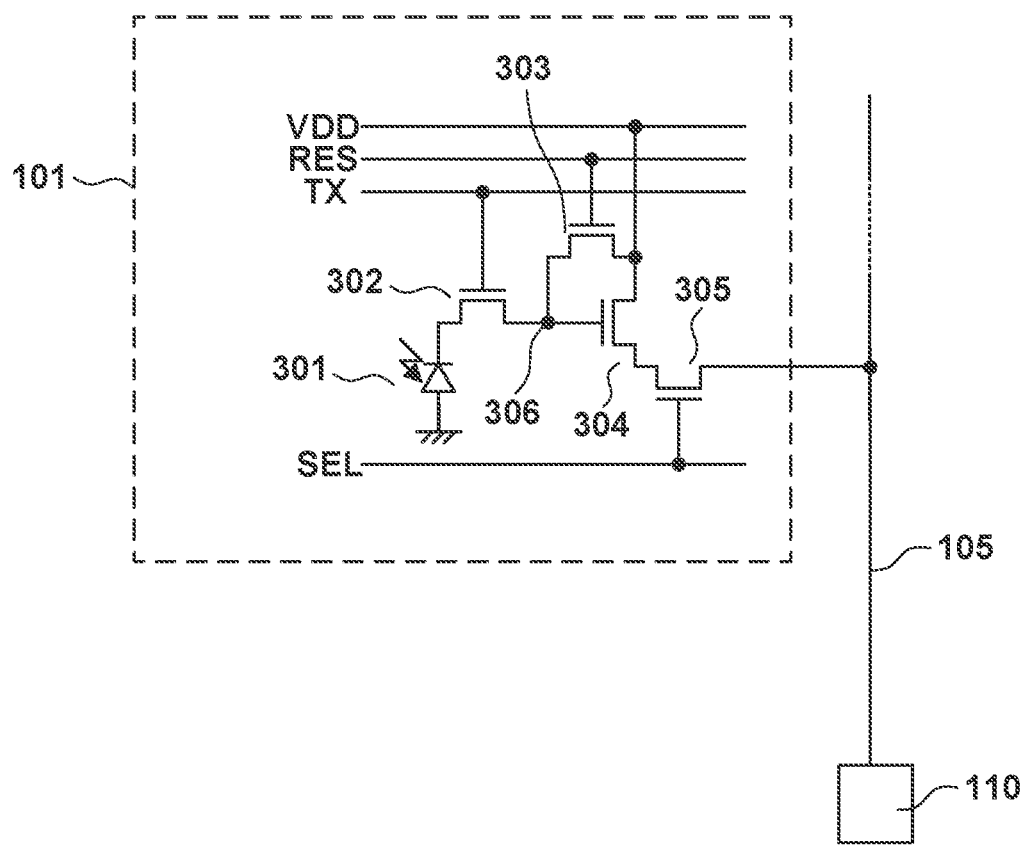
FIG. 3 is a view showing an arrangement example of a pixel in the photoelectric conversion device according to the first embodiment.

FIG. 3 shows an arrangement example of each of the pixels 101 (101-1 and 101-2). The pixel 101 includes a photodiode 301 (photoelectric conversion element). The pixel 101 can also include, for example, a transfer transistor 302, a reset transistor 303, an amplification transistor 304, and a selection transistor 305. The drains of the reset transistor 303 and the amplification transistor 304 can be connected to the voltage supply line to which the reference voltage (VDD) is supplied. More specifically, the drains of the reset transistor 303 and the amplification transistor 304 of the aperture pixel 101-1 can be connected to the voltage supply line 200-1. The drains of the reset transistor 303 and the amplification transistor 304 of the light-shielded pixel 101-2 can be connected to the voltage supply line 200-3.

The transfer transistor 302 transfers signal charges generated in the photodiode 301 to a floating diffusion (to be referred to as an FD hereinafter) 306. The amplification transistor 304 outputs an output corresponding to the potential of the FD 306 to the vertical output line 105 via the selection transistor 305. The amplification transistor 304 can form the source follower circuit together with the current source 110. The gate of the amplification transistor 304 is connected to the FD 306. The reset transistor 303 resets a node connected to the gate of the amplification transistor 304, that is, the FD 306 to a predetermined potential (reset potential). The signals of the pixels 101 in the row selected by the vertical scanning circuit 102 are output to the vertical output line 105. Here, the vertical output line 105 is connected to the readout circuit 106. The current source 110 is also connected to the vertical output line 105. The current source 110 supplies a constant bias current to the amplification transistor 304 via the vertical output line 105.

Here, if strong light enters the aperture pixel 101-1 in the aperture pixel array 120, the voltage of the vertical output line 105 (vertical signal line 105-1) drops greatly, and this can cause the voltage of the voltage supply line 200-1 for the aperture pixel array 120 to fluctuate. However, on the semiconductor substrate 1, the voltage supply line 200-3 for the light-shielded pixel array 130 is electrically separated from the voltage supply line 200-1 for the aperture pixel array 120. Accordingly, the influence of the fluctuation of the voltage of the voltage supply line 200-1 for the aperture pixel array 120 on the voltage of the voltage supply line 200-3 for the light-shielded pixel array 130 can be ignored. Therefore, even if strong light enters the aperture pixel 101-1 in the aperture pixel array 120, the voltage of the voltage supply line 200-3 in the light-shielded pixel array 130 does not fluctuate so does not influence the dark signal obtained from the light-shielded pixel 101-2 in the light-shielded pixel array 130. However, in the case in which strong light enters the aperture pixel 101-1 in the aperture pixel array 120, if the bias voltage supplied to each of the current sources 110 (110-1 and 110-2) fluctuates, this can influence the signal output from the pixel array 100, and the image quality can deteriorate.

Figure 4:
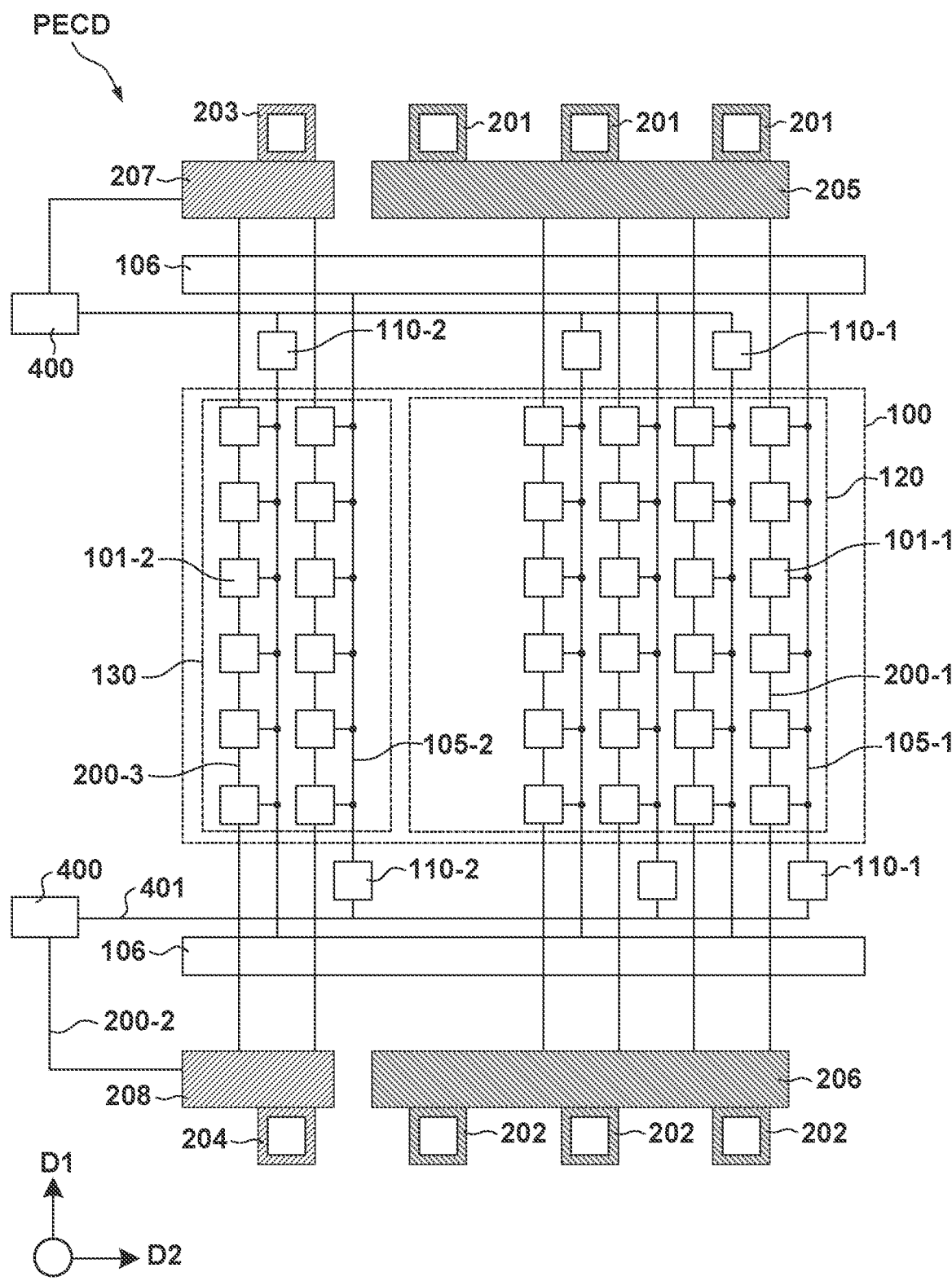
FIG. 4 is a view for explaining a main part of the photoelectric conversion device according to the first embodiment.

FIG. 4 exemplarily shows the configuration for reducing the influence of strong light entering the aperture pixel 101-1 in the aperture pixel array 120 on the bias voltage supplied to the current source 110. As exemplarily shown in FIG. 4, the photoelectric conversion device PECD includes a bias circuit 400 that supplies the bias voltage to the current sources 110 (110-1 and 110-2). The bias voltage generated by the bias circuit 400 is supplied to the current source 110 in each column via a bias line 401.

The bias circuit 400 is connected to the pad 204 (second pad) via a voltage supply line 200-2 (second voltage supply line). The second reference voltage (VDD) supplied to the pad 203 or 204 (second pad) from the outside of the semiconductor substrate 1 is supplied to the bias circuit 400 via the voltage supply line 200-2 (second voltage supply line). Accordingly, even if the voltage of the voltage supply line 200-1 in the aperture pixel array 120 fluctuates due to strong light entering the aperture pixel 101-1 in the aperture pixel array 120, the voltage of the voltage supply line 200-2 is not influenced by this. Therefore, even if strong light enters the aperture pixel 101-1 in the aperture pixel array 120, it is suppressed that the bias voltage supplied to the current sources 110 (110-1 and 110-2) fluctuates due to this.

Figure 5:
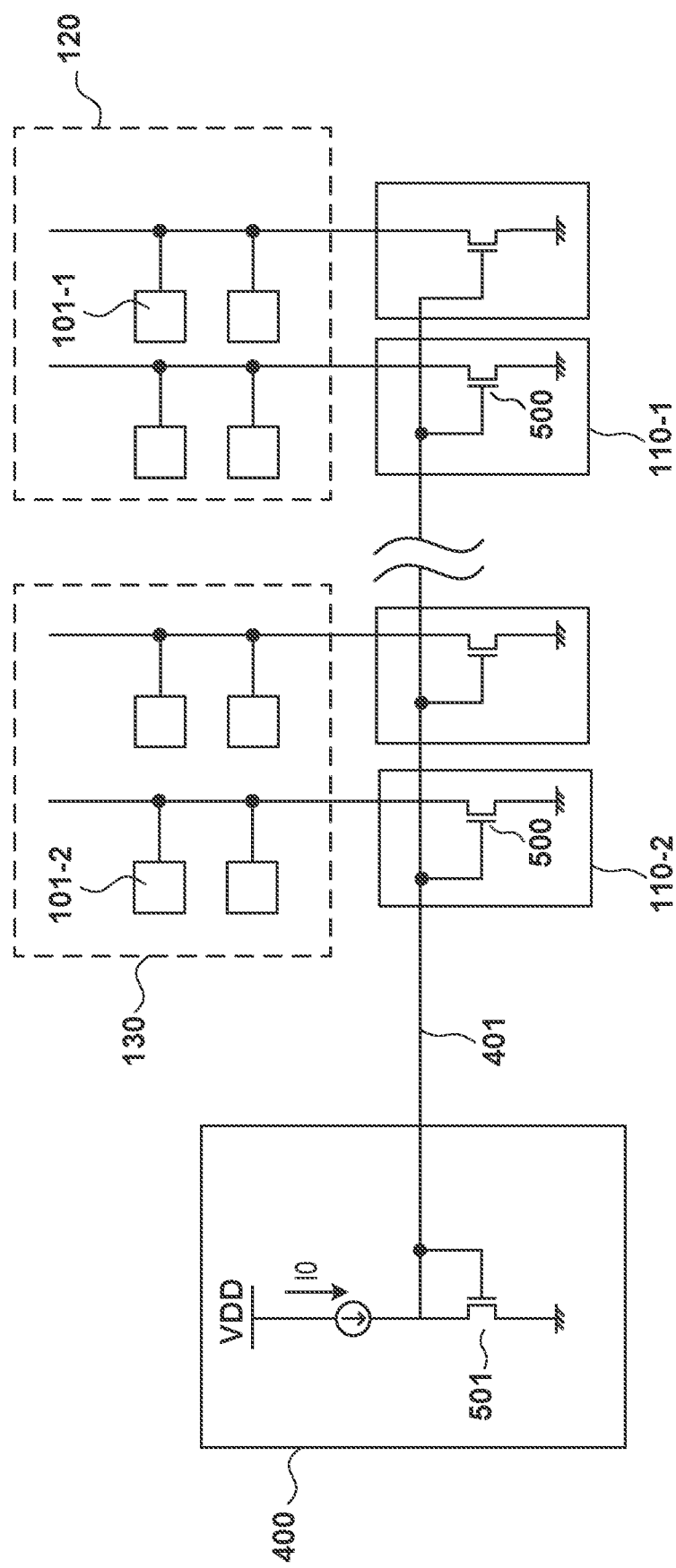
FIG. 5 is a view showing an arrangement example of current sources and a bias circuit in the photoelectric conversion device according to the first embodiment.

FIG. 5 shows an arrangement example of the current sources 110 and the bias circuit 400. Each of the current sources 110 (110-1 and 110-2) can include, for example, a load transistor 500. However, this is merely an example, and the current source 110 can include, for example, a gate-grounded transistor, a transistor for controlling the current path, and the like in addition to the load transistor 500. The bias circuit 400 can include, for example, a transistor 501 that forms a current mirror circuit together with the load transistor 500 of the current source 110.

Assume that the first reference voltage (VDD) is supplied to the bias circuit 400 via the pad 201 or 202. In this case, if the first reference voltage of the voltage supply line 200-1 fluctuates due to strong incident light, the bias voltage generated by the bias circuit 400 can fluctuate. However, in this embodiment, the second reference voltage (VDD) is supplied to the bias circuit 400 via the pad 203 or 204 electrically separated from the pad 201 or 202 on the semiconductor substrate 1. Therefore, even if the first reference voltage of the voltage supply line 200-1 fluctuates due to strong incident light, the bias voltage generated by the bias circuit 400 is less influenced by this. Thus, a deterioration in image quality can be suppressed.

In the example shown in FIG. 5, the bias circuit 400 includes only the transistor 501 that forms the current mirror circuit, but this is merely an example. For example, if a gate-grounded transistor or the like is arranged in the current source 110 in each column, the bias circuit 400 can include a configuration that generates a bias voltage for this transistor. Alternatively, a reference current may be supplied from the outside of the semiconductor substrate 1, and the bias circuit 400 may generate a bias voltage for the load transistor 500 and/or the gate-grounded transistor by the current mirror circuit configuration.

As has been described above, the reference voltage may be, for example, the ground voltage (for example, the voltage of the well region in the semiconductor substrate 1). Further, the pixel array 100 may include a vertical optical black region for a correction application different from that of the light-shielded pixel array 130 that can be formed as the horizontal optical black region. As to the arrangement of the light-shielded pixel array 130, for example, if the number of columns in the light-shielded pixel array 130 is sufficiently large such as several hundreds of columns, an aperture region corresponding to about several tens of columns may be included in the light-shielded pixel region.

Figure 6:
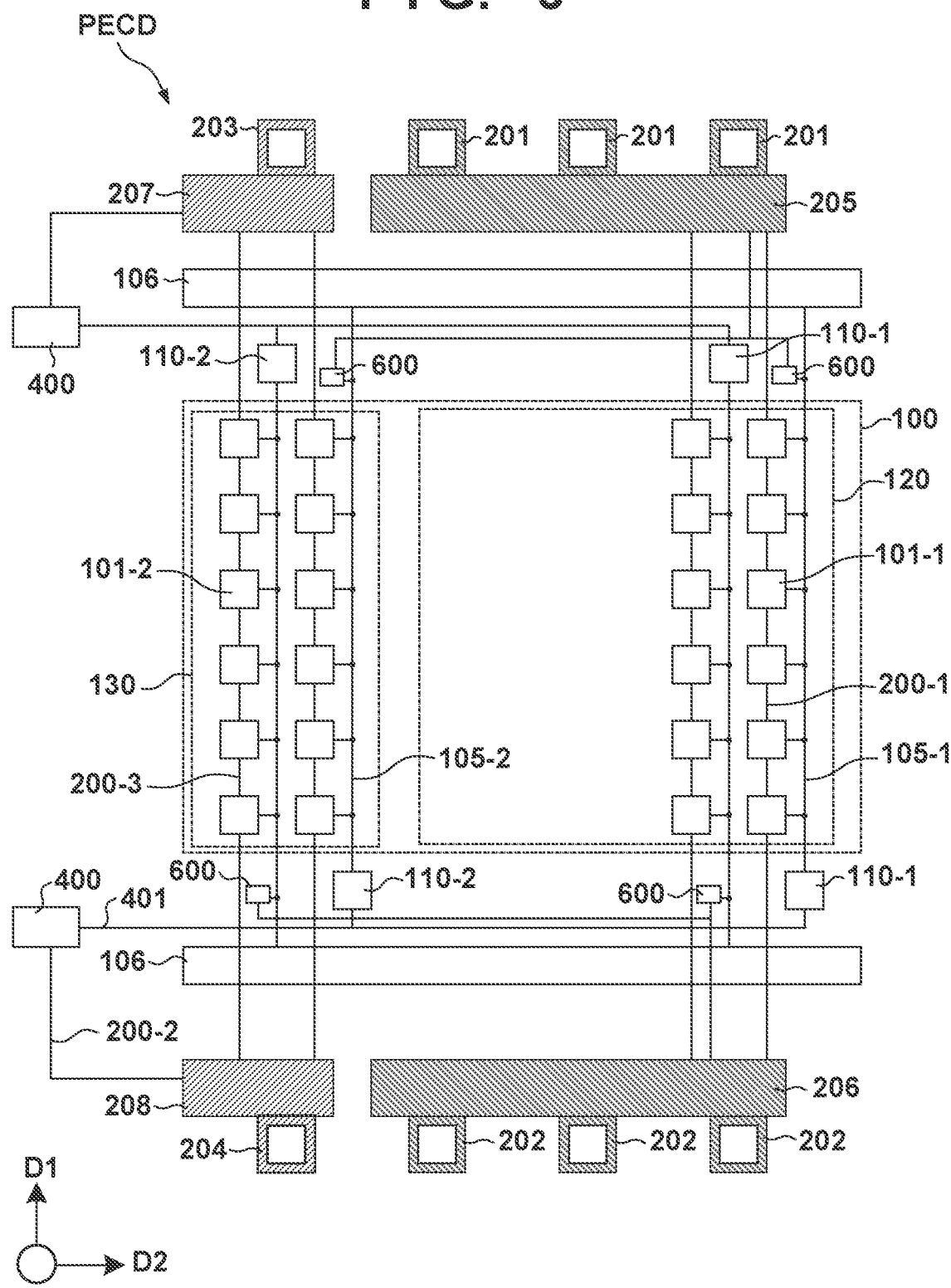
FIG. 6 is a view for explaining a main part of a photoelectric conversion device according to the second embodiment.

FIG. 6 exemplarily shows the arrangement of a photoelectric conversion device PECD according to the second embodiment. Matters that are not mentioned as the second embodiment can follow the first embodiment. The photoelectric conversion device PECD according to the second embodiment can include a plurality of clip circuits 600 that limit voltage amplitudes of a plurality of vertical signal lines 105-1, respectively. The photoelectric conversion device PECD according to the second embodiment may further include a plurality of clip circuits 600 that limit voltage amplitudes of a plurality of second vertical signal lines 105-2, respectively. The nominal value of a reference voltage (VDD_VCLIP) may be equal to the nominal value of a reference voltage (VDD). In this case, the reference voltage (VDD) can be supplied from the plurality of clip circuits 600 to pads 201 or 202 for an aperture pixel array 120.

Figure 7:
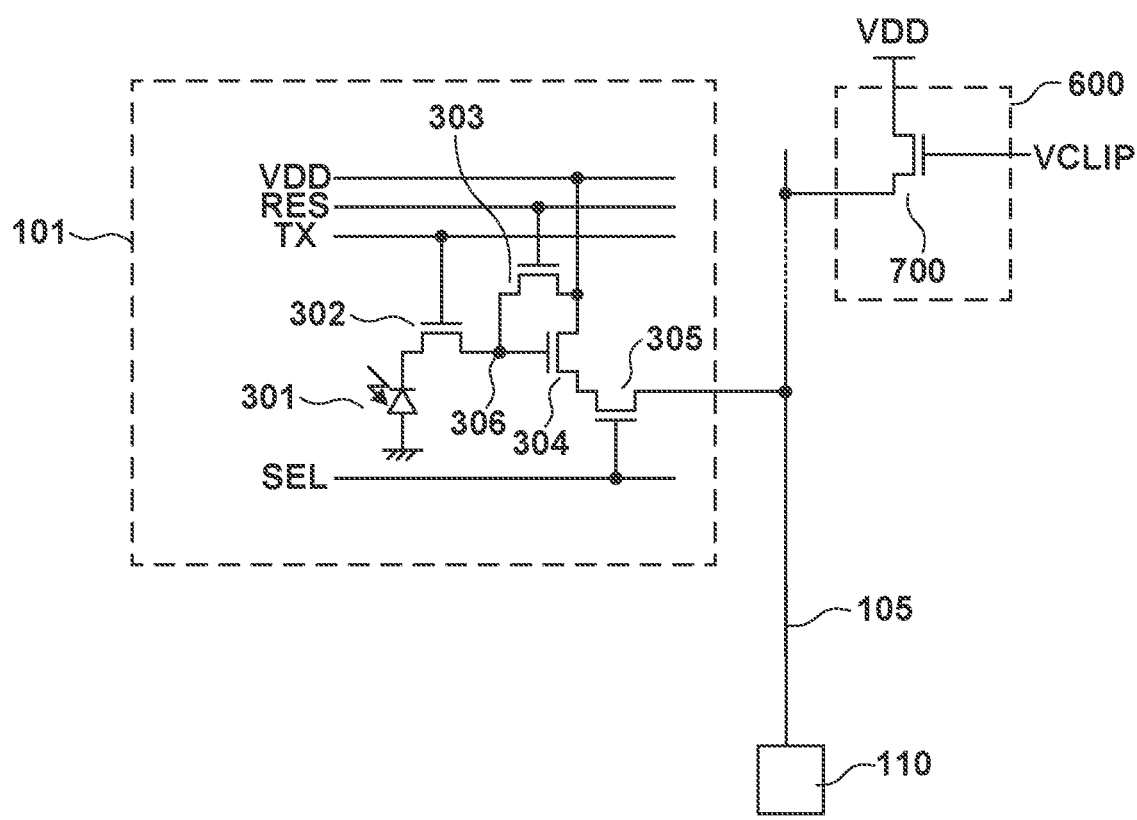
FIG. 7 is a view showing an arrangement example of a clip circuit in the photoelectric conversion device according to the second embodiment.

FIG. 7 shows an arrangement example of the clip circuit 600. The clip circuit 600 can include a clip transistor 700. A clip control voltage VCLIP is supplied to the gate of the clip transistor 700, and the clip transistor 700 can be configured to limit (clip) the voltage amplitude of the vertical output line 105 (105-1 or 105-2) in accordance with the clip control voltage VCLIP. The clip control voltage VCLIP can be set such that a current flows from a pixel 101 to a current source 110 with normal incident light, that is, so as not to narrow the dynamic range. If strong light enters, a current is supplied from the reference voltage (VDD) to the vertical output line 105 through the clip transistor 700. Thus, it can be prevented that the current to the current source 110 is interrupted. However, when the current flows from the reference voltage (VDD) to the vertical output line 105 through the clip transistor 700, the voltage of a voltage supply line 200-1 may fluctuate. Also in this case, since the reference voltage (VDD) is supplied to the bias circuit 400 via a pad 203 or 204, the bias circuit 400 is not influenced by the fluctuation of the voltage of the voltage supply line 200-1.

Figure 8:
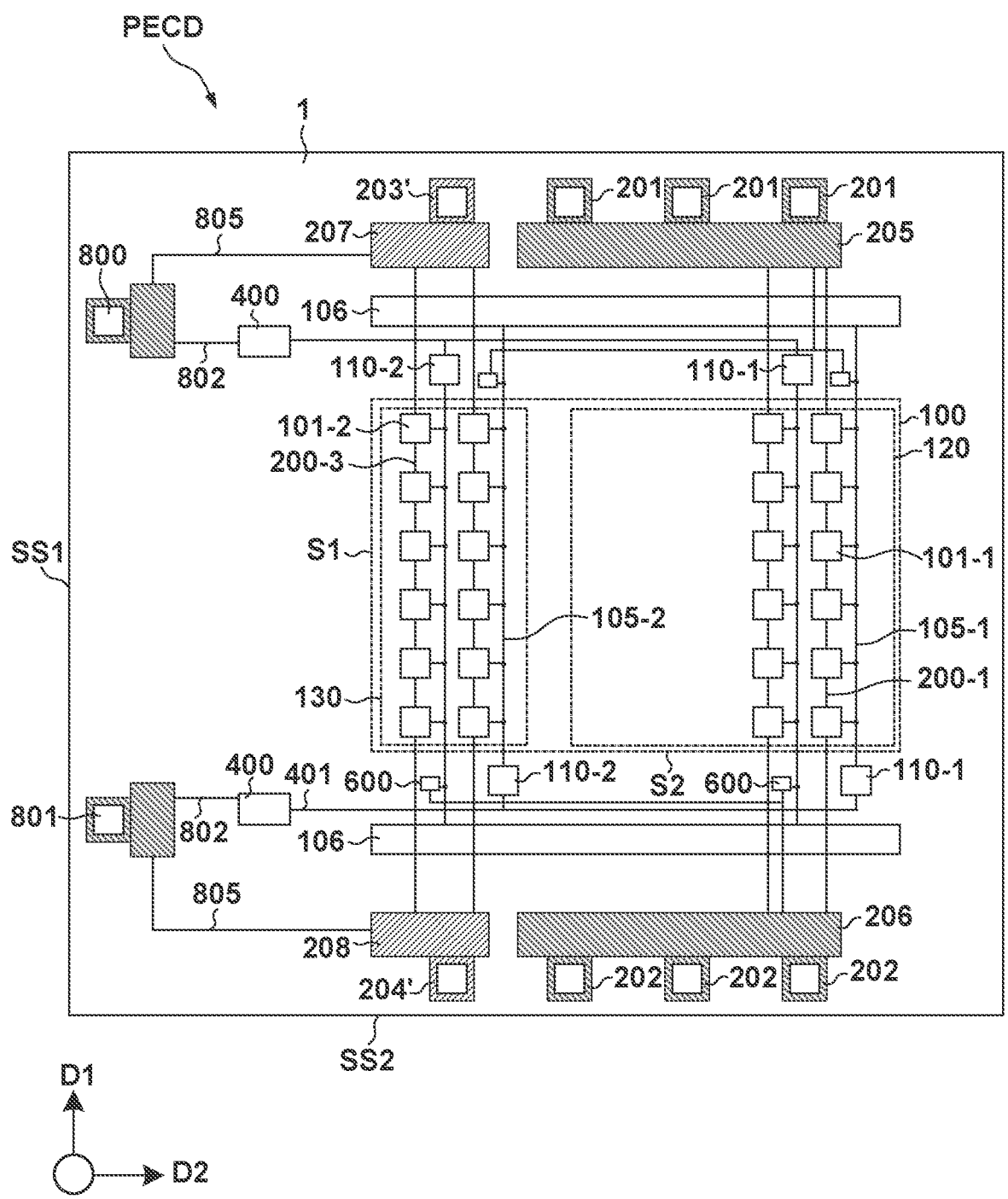
FIG. 8 is a view for explaining a main part of a photoelectric conversion device according to the third embodiment.

FIG. 8 exemplarily shows the arrangement of a photoelectric conversion device PECD according to the third embodiment. Matters that are not mentioned as the third embodiment can follow the first or second embodiment. The photoelectric conversion device PECD according to the third embodiment includes a voltage supply line 802 (second voltage supply line) connected to a bias circuit 400, and a pad 800 or 801 (second pad) connected to the voltage supply line 802 (second voltage supply line). The second reference voltage (VDD) supplied to the pad 800 or 801 (second pad) from the outside of a semiconductor substrate 1 is supplied to the bias circuit 400 via the voltage supply line 802 (second voltage supply line).

The photoelectric conversion device PECD according to the third embodiment can include pas 203' and 204' (third pads) for a light-shielded pixel array 130. The pads 203' and 204' (third pads) are connected to both ends of one or a plurality of voltage supply lines 200-3 for the light-shielded pixel array 130, and supply, to a plurality of light-shielded pixels 101-2, the third reference voltage (VDD) supplied from the outside of the semiconductor substrate 1. The third reference voltage (VDD) is a voltage having a nominal value equal to the nominal value of the first reference voltage (VDD) for an aperture pixel array 120. The pads 203' and 204' (third pads) are electrically separated from pads 201 and 202 (first pads), and arranged spaced apart from the pads 201 and 202 (first pads).

The pads 203' and 204' (third pads) can be connected to the pad 800 or 801 (second pad) or a wiring pattern 207 or 208 by a connection line 805. The pads 203' and 204' (third pads) may be omitted, and in this case, the pads 800 and 801 (second pads) supply, to the plurality of light-shielded pixels 101-2, the second reference voltage (VDD) supplied from the outside of the semiconductor substrate 1.

A pixel array 100 has a rectangular outer shape, and the plurality of light-shielded pixels 101-2 can be arranged along, among four sides of the rectangle, a first side S1 (a side parallel to a first direction D1) parallel to a plurality of columns. The pad 800 or 801 (second pad) can be arranged between a virtual straight line including the first side S1 and a side SS1 parallel to the virtual straight line on the semiconductor substrate 1. The pads 203' and 204' (third pads) can be arranged between a second side S2 adjacent to the first side S1 and a side SS2 parallel to the second side S2 on the semiconductor substrate 1.

Figure 9:
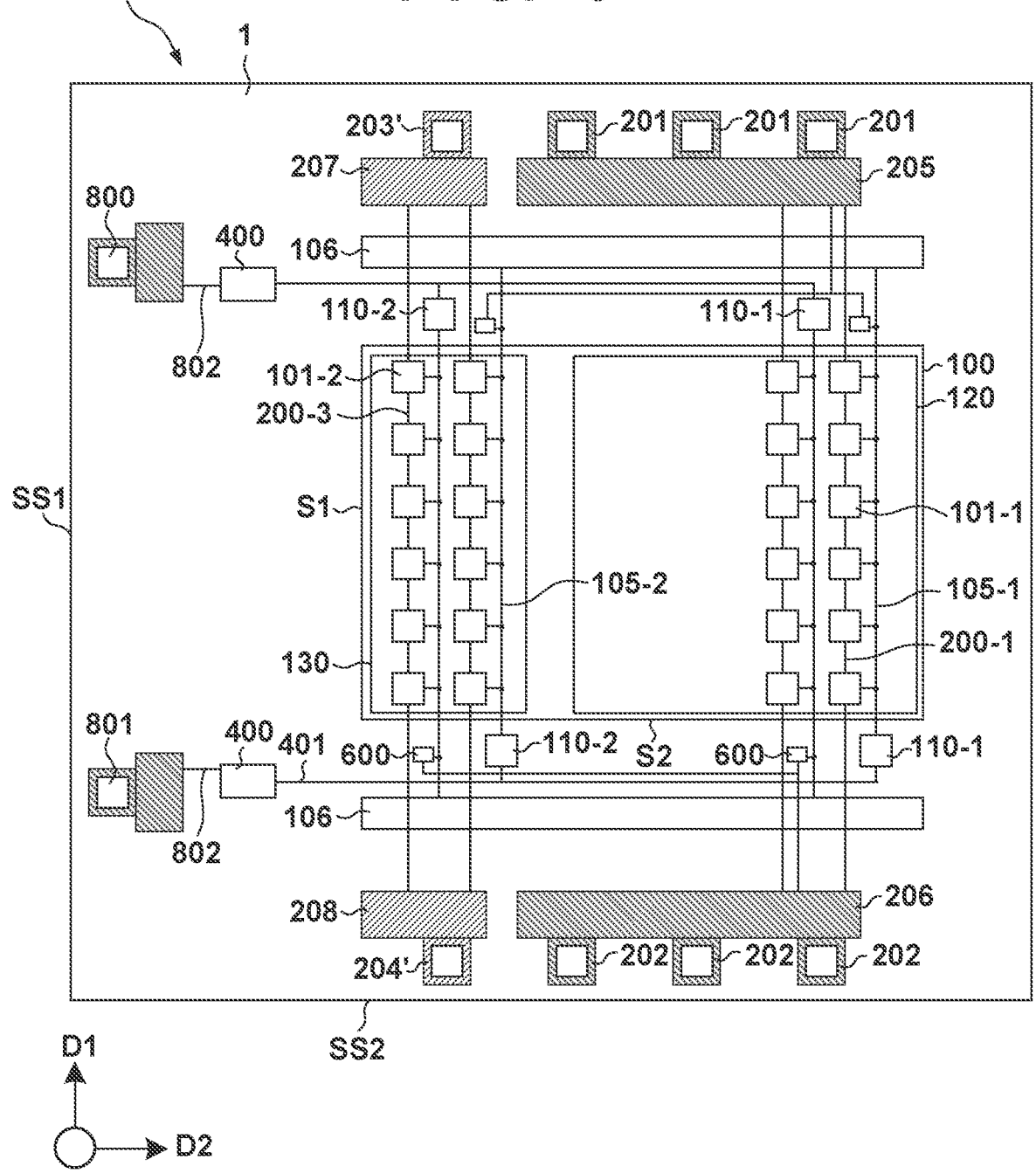
FIG. 9 is a view for explaining a main part of a photoelectric conversion device according to the fourth embodiment.

FIG. 9 exemplarily shows the arrangement of a photoelectric conversion device PECD according to the fourth embodiment. Matters that are not mentioned as the fourth embodiment can follow the third embodiment. The photoelectric conversion device PECD according to the fourth embodiment has an arrangement obtained by removing the connection line 805 from the photoelectric conversion device PECD according to the third embodiment. In the photoelectric conversion device PECD according to the fourth embodiment, the nominal value of the third reference voltage supplied to pads 203' and 204' (third pads) can be made different from the nominal value of the second reference voltage supplied to a pad 800 or 801 (second pad). Alternatively, the degree of freedom of arrangement of the pads improves in the photoelectric conversion device PECD according to the fourth embodiment.

Figure 10:
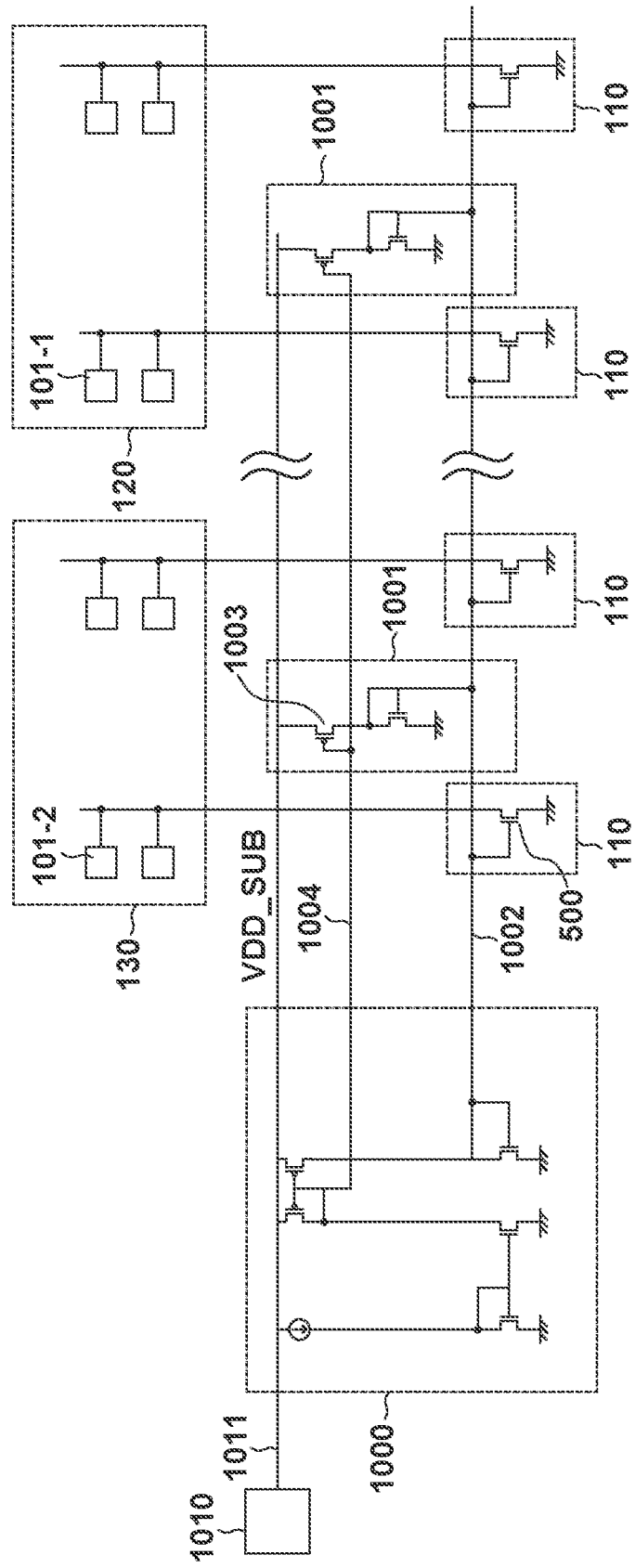
FIG. 10 is a view for explaining a main part of a photoelectric conversion device according to the fifth embodiment.

FIG. 10 exemplarily shows a part of the arrangement of a photoelectric conversion device PECD according to the fifth embodiment. Matters that are not mentioned as the fifth embodiment can follow the first to fourth embodiments. In the photoelectric conversion device PECD according to the fifth embodiment, the bias circuit 400 in the photoelectric conversion device PECD according to each of the first to fourth embodiments is replaced with a bias circuit 1000.

The bias circuit 1000 supplies a bias voltage to a plurality of current sources 110 (110-1 and 110-2) via a bias line 1002. The photoelectric conversion device PECD according to the fifth embodiment can further include one or a plurality of additional bias circuits 1001. The additional bias circuit 1001 can be configured to supply a voltage equal to the bias voltage generated by the bias circuit 1000 to the bias line 1002. A reference voltage VDD_SUB (second reference voltage) can be supplied to the bias circuit 1000 and the one or the plurality of additional bias circuits 1001 via one or a plurality of pads 1010 and a voltage supply line 1011 (second voltage supply line). The reference voltage VDD_SUB may have a nominal value equal to the nominal value of the reference voltage (VDD) supplied to pixels 101 in a pixel array 100, or may have a nominal value different from the nominal value of the reference voltage (VDD) supplied to the pixels 101 in the pixel array 100. The additional bias circuit 1001 can be arranged between the pixel array 100 and a readout circuit 106. The one or the plurality of additional bias circuits 1001 can act to complement the ability of the bias circuit 1000 to drive the bias line 1002. The one or the plurality of additional bias circuits 1001 can include load transistors 1003, respectively.

The bias circuit 1000 supplies the bias voltage for the additional bias circuit 1001 to the gate of the load transistor 1003 of the additional bias circuit 1001 via a bias line 1004. Further, the bias circuit 1000 supplies the bias voltage for the current source 110 to the gate of a load transistor 500 of the current source 110 via a bias line 1002.

The additional bias circuit 1001 may include, for example, a gate-grounded transistor. In this case, the bias circuit 1000 can supply the bias voltage to the gate-grounded transistor via the bias line 1004.

Also with the arrangement as described above, even if the first reference voltage of a voltage supply line 200-1 for an aperture pixel array 120 fluctuates due to strong incident light, it is possible to reduce the influence on the bias voltage supplied to the current source 110 and suppress a deterioration in image quality.

An example of a photoelectric conversion system using the photoelectric conversion device according to each embodiment described above will be described below.

Figure 11:
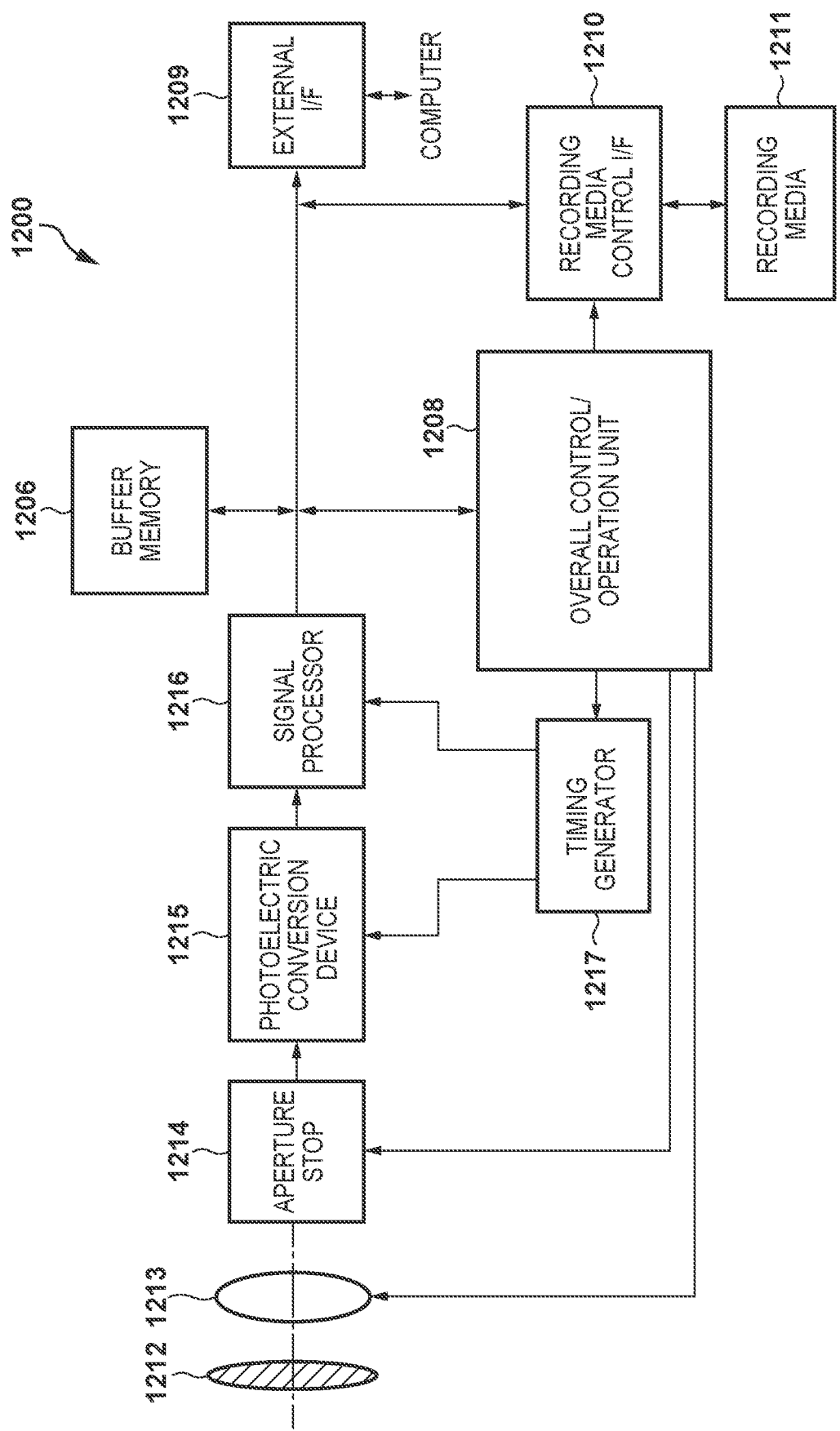
FIG. 11 is a block diagram exemplarily showing the arrangement of a photoelectric conversion system.

FIG. 11 is a block diagram showing the arrangement of a photoelectric conversion system 1200 according to this embodiment. The photoelectric conversion system 1200 according to this embodiment includes a photoelectric conversion device 1215. Here, any of the photoelectric conversion devices described in the above-described embodiments can be applied to the photoelectric conversion device 1215. The photoelectric conversion system 1200 can be used as, for example, an image sensing system. Practical examples of the image sensing system are a digital still camera, a digital camcorder, and a monitoring camera. FIG. 11 shows an example of a digital still camera as the photoelectric conversion system 1200.

The photoelectric conversion system 1200 shown in FIG. 11 includes the photoelectric conversion device 1215, a lens 1213 for forming an optical image of an object on the photoelectric conversion device 1215, an aperture 1214 for changing the amount of light passing through the lens 1213, and a barrier 1212 for protecting the lens 1213. The lens 1213 and the aperture 1214 form an optical system for concentrating light to the photoelectric conversion device 1215.

The photoelectric conversion system 1200 includes a signal processor 1216 for processing an output signal output from the photoelectric conversion device 1215. The signal processor 1216 performs an operation of signal processing of performing various kinds of correction and compression for an input signal, as needed, thereby outputting the resultant signal. The photoelectric conversion system 1200 further includes a buffer memory unit 1206 for temporarily storing image data and an external interface unit (external I/F unit) 1209 for communicating with an external computer or the like. Furthermore, the photoelectric conversion system 1200 includes a recording medium 1211 such as a semiconductor memory for recording or reading out image sensing data, and a recording medium control interface unit (recording medium control I/F unit) 1210 for performing a recording or reading operation in or from the recording medium 1211. The recording medium 1211 may be incorporated in the photoelectric conversion system 1200 or may be detachable. In addition, communication with the recording medium 1211 from the recording medium control I/F unit 1210 or communication from the external I/F unit 1209 may be performed wirelessly.

Furthermore, the photoelectric conversion system 1200 includes a general control/arithmetic unit 1208 that performs various kinds of arithmetic operations and controls the entire digital still camera, and a timing generation unit 1217 that outputs various kinds of timing signals to the photoelectric conversion device 1215 and the signal processor 1216. Here, the timing signal and the like may be input from the outside, and the photoelectric conversion system 1200 need only include at least the photoelectric conversion device 1215 and the signal processor 1216 that processes an output signal output from the photoelectric conversion device 1215. As described in the fourth embodiment, the timing generation unit 1217 may be incorporated in the photoelectric conversion device. The general control/arithmetic unit 1208 and the timing generation unit 1217 may be configured to perform some or all of the control functions of the photoelectric conversion device 1215.

The photoelectric conversion device 1215 outputs an image signal to the signal processor 1216. The signal processor 1216 performs predetermined signal processing for the image signal output from the photoelectric conversion device 1215 and outputs image data. The signal processor 1216 also generates an image using the image signal. Furthermore, the signal processor 1216 may perform distance measurement calculation for the signal output from the photoelectric conversion device 1215. Note that the signal processor 1216 and the timing generation unit 1217 may be incorporated in the photoelectric conversion device. That is, each of the signal processor 1216 and the timing generation unit 1217 may be provided on a substrate on which pixels are arranged or may be provided on another substrate. An image sensing system capable of acquiring a higher-quality image can be implemented by forming an image sensing system using the photoelectric conversion device of each of the above-described embodiments.

Figure 12A:
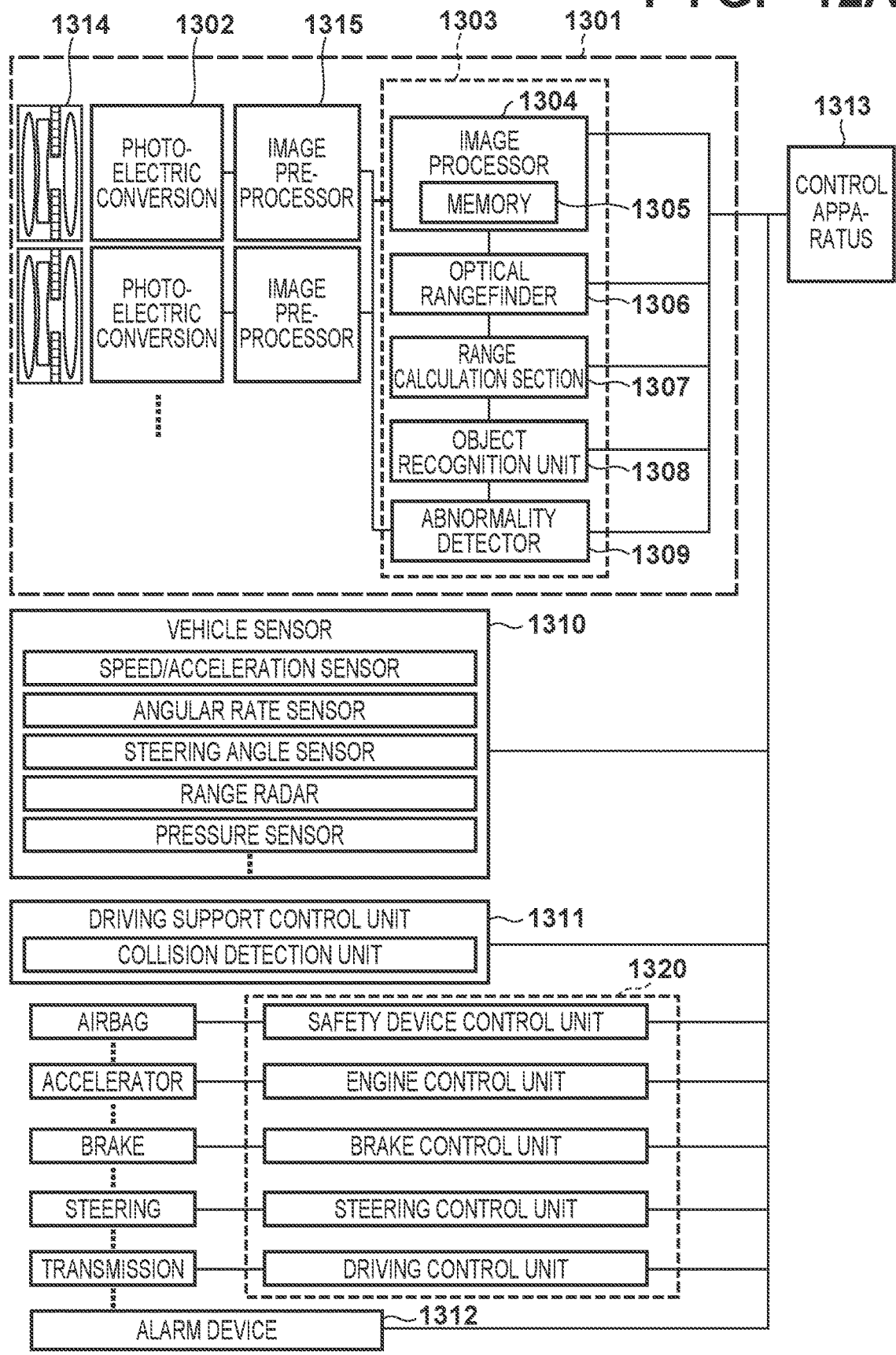
FIGS. 12A and 12B are views exemplarily showing the arrangement of a photoelectric conversion system and the arrangement of a moving body, respectively.
Figure 12B:
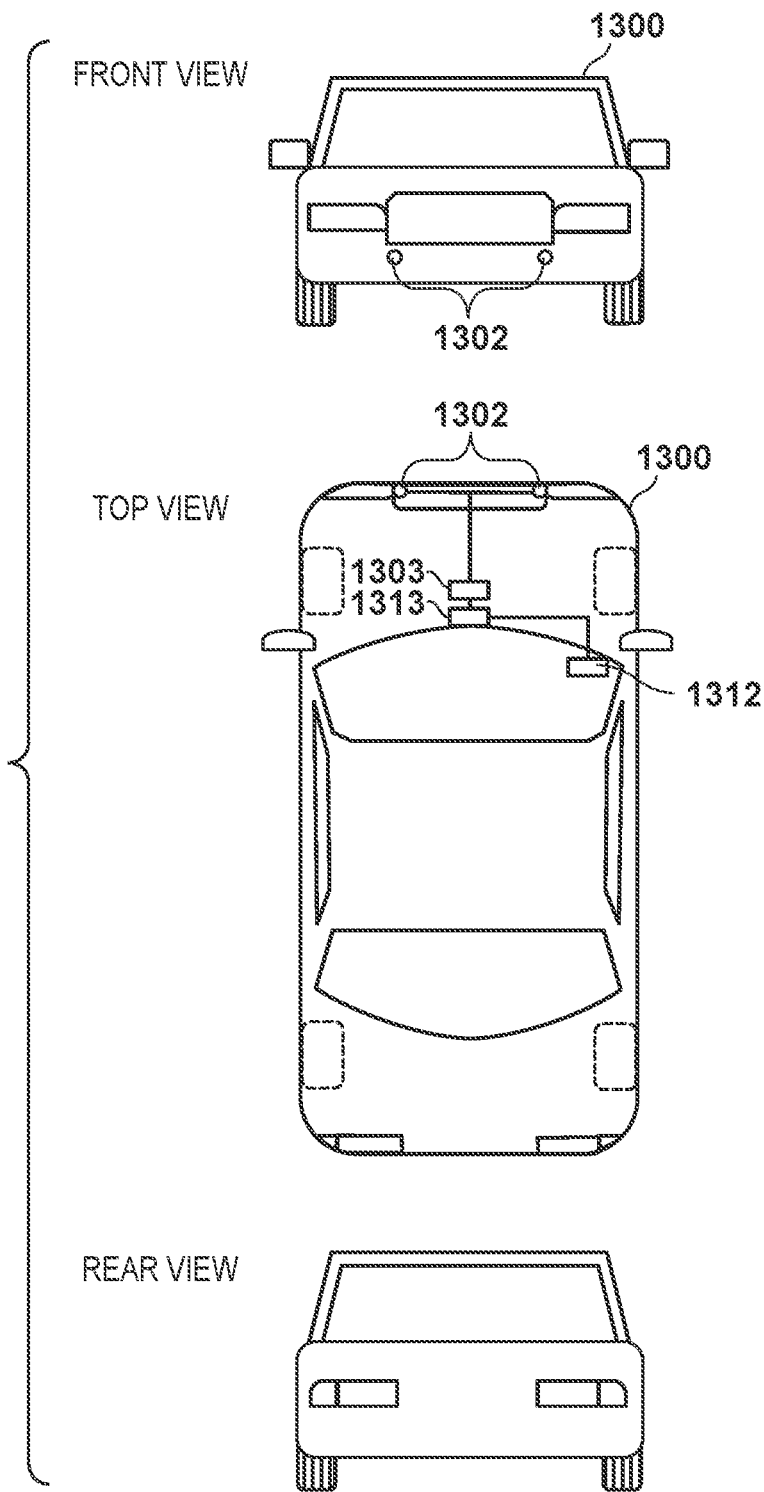
Figure 13:
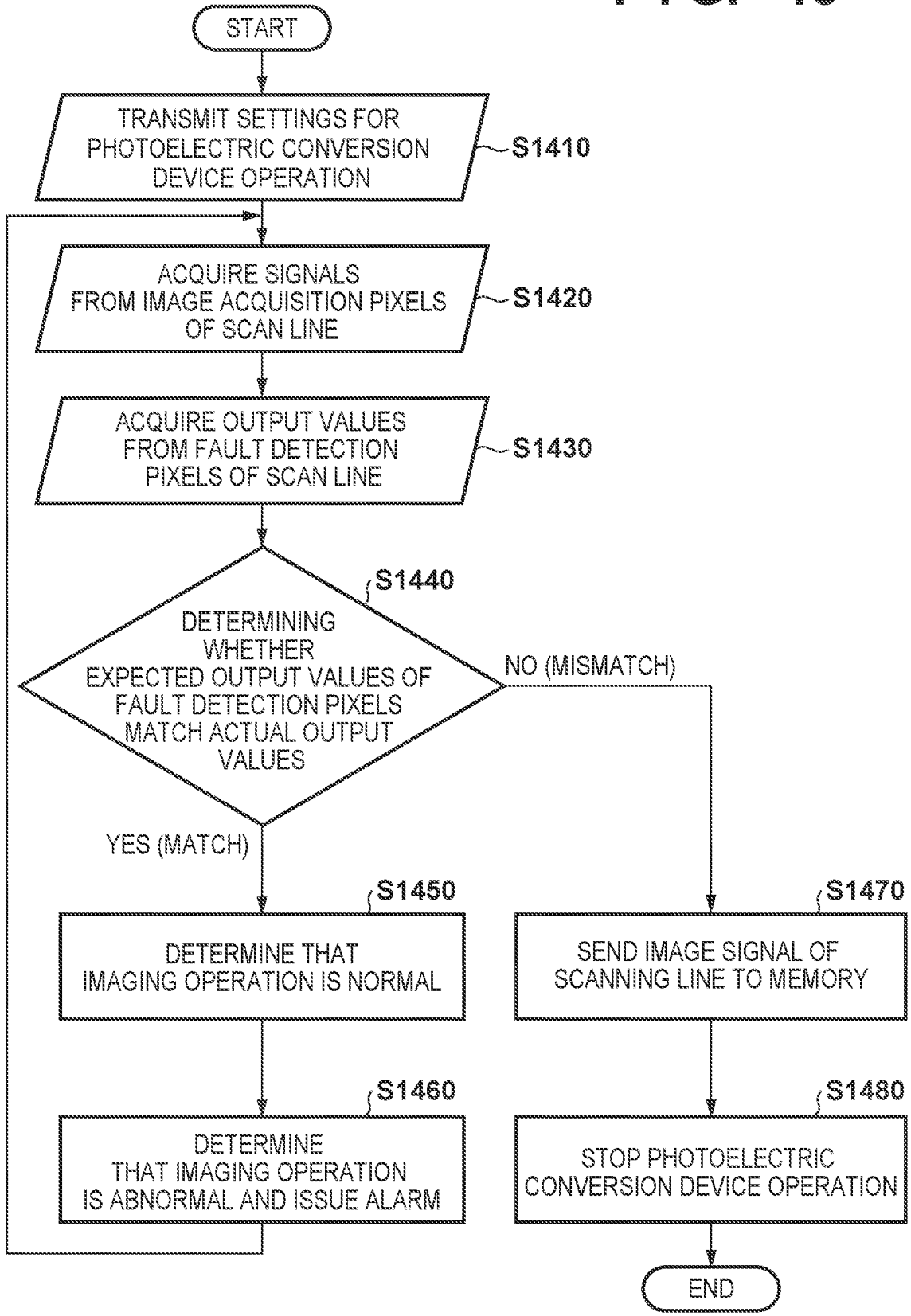
FIG. 13 is a flowchart illustrating an operation of the photoelectric conversion system.

A photoelectric conversion system and a moving body according to this embodiment will be described with reference to FIGS. 12A to 13. FIGS. 12A and 12B are schematic views showing an arrangement example of the photoelectric conversion system and an arrangement example of the moving body, respectively, according to this embodiment. FIG. 13 is a flowchart illustrating an operation of the photoelectric conversion system according to this embodiment. In this embodiment, an example of an in-vehicle camera will be described as the photoelectric conversion system.

FIGS. 12A and 12B show examples of a vehicle system and a photoelectric conversion system that is incorporated in the vehicle system and performs image sensing. A photoelectric conversion system 1301 includes a photoelectric conversion device 1302, an image preprocessor 1315, an integrated circuit 1303, and an optical system 1314. The optical system 1314 forms an optical image of an object on the photoelectric conversion device 1302. The photoelectric conversion device 1302 converts, into an electrical signal, the optical image of the object formed by the optical system 1314. The photoelectric conversion device 1302 is the photoelectric conversion device according to any one of the above-described embodiments. The image preprocessor 1315 performs predetermined signal processing for the signal output from the photoelectric conversion device 1302. The function of the image preprocessor 1315 may be incorporated in the photoelectric conversion device 1302. In the photoelectric conversion system 1301, at least two sets of the optical systems 1314, the photoelectric conversion devices 1302, and the image preprocessors 1315 are arranged, and an output from the image preprocessor 1315 of each set is input to the integrated circuit 1303.

The integrated circuit 1303 is an image sensing system application specific integrated circuit, and includes an image processor 1304 with a memory 1305, an optical distance measurement unit 1306, a distance measurement calculation unit 1307, an object recognition unit 1308, and an abnormality detection unit 1309. The image processor 1304 performs image processing such as development processing and defect correction for the output signal from each image preprocessor 1315. The memory 1305 temporarily stores a captured image, and stores the position of a defect in the captured image. The optical distance measurement unit 1306 performs focusing or distance measurement of an object. The distance measurement calculation unit 1307 calculates distance measurement information from a plurality of image data acquired by the plurality of photoelectric conversion devices 1302. The object recognition unit 1308 recognizes objects such as a vehicle, a road, a road sign, and a person. Upon detecting an abnormality of the photoelectric conversion device 1302, the abnormality detection unit 1309 notifies a main control unit 1313 of the abnormality.

The integrated circuit 1303 may be implemented by dedicated hardware, a software module, or a combination thereof. Alternatively, the integrated circuit 1303 may be implemented by a Field Programmable Gate Array (FPGA), an Application Specific Integrated Circuit (ASIC), or a combination thereof.

The main control unit 1313 comprehensively controls the operations of the photoelectric conversion system 1301, vehicle sensors 1310, a control unit 1320, and the like. A method in which the photoelectric conversion system 1301, the vehicle sensors 1310, and the control unit 1320 each individually include a communication interface and transmit/receive control signals via a communication network (for example, CAN standards) may be adopted without providing the main control unit 1313.

The integrated circuit 1303 has a function of transmitting a control signal or a setting value to each photoelectric conversion device 1302 by receiving the control signal from the main control unit 1313 or by its own control unit.

The photoelectric conversion system 1301 is connected to the vehicle sensors 1310 and can detect the traveling state of the self-vehicle such as the vehicle speed, the yaw rate, and the steering angle, the external environment of the self-vehicle, and the states of other vehicles and obstacles. The vehicle sensors 1310 also serve as a distance information acquisition unit that acquires distance information to a target object. Furthermore, the photoelectric conversion system 1301 is connected to a driving support control unit 1311 that performs various driving support operations such as automatic steering, adaptive cruise control, and anti-collision function. More specifically, with respect to a collision determination function, based on the detection results from the photoelectric conversion system 1301 and the vehicle sensors 1310, a collision with another vehicle or an obstacle is estimated or the presence/absence of a collision is determined. This performs control to avoid a collision when the collision is estimated or activates a safety apparatus at the time of a collision.

Furthermore, the photoelectric conversion system 1301 is also connected to an alarming device 1312 that generates an alarm to the driver based on the determination result of a collision determination unit. For example, if the determination result of the collision determination unit indicates that the possibility of a collision is high, the main control unit 1313 performs vehicle control to avoid a collision or reduce damage by braking, releasing the accelerator pedal, or suppressing the engine output. The alarming device 1312 sounds an alarm such as a sound, displays alarming information on the screen of a display unit such as a car navigation system or a meter panel, applies a vibration to the seat belt or a steering wheel, thereby giving an alarm to the user.

Next, a fault detection operation of the photoelectric conversion device 1302 in the photoelectric conversion system 1301 will be described with reference to FIG. 13. The fault detection operation of the photoelectric conversion device 1302 can be executed in accordance with steps S1410 to S1480. In step S1410, the startup setting of the photoelectric conversion device 1302 is performed. That is, setting information for the operation of the photoelectric conversion device 1302 is transmitted from outside (for example, the main control unit 1313) of the photoelectric conversion system 1301 or inside the photoelectric conversion system 1301, and the photoelectric conversion device 1302 starts an image sensing operation and a fault detection operation. Then, in step S1420, the photoelectric conversion device 1302 acquires a pixel signal from each effective pixel. In step S1430, the photoelectric conversion device 1302 acquires an output value from a fault detection pixel provided for fault detection. The fault detection pixel includes a photoelectric conversion element like the effective pixel. A predetermined voltage is written into this photoelectric conversion element. The fault detection pixel outputs a signal corresponding to the voltage written in this photoelectric conversion element. Note that step S1420 and step S1430 may be performed in a reverse order. Next, in step S1440, the photoelectric conversion system 1301 performs applicability determination between the expected output value of the fault detection pixel and the actual output value of the fault detection pixel. If the expected output value and the actual output value match as a result of the applicability determination in step S1440, the photoelectric conversion system 1301 advances to processing in step S1450, determines that the image sensing operation is being performed normally, and advances to processing in step S1460. In step S1460, the photoelectric conversion system 1301 transmits each pixel signal of the scanning target row to the memory 1305 to temporarily store the pixel signal. Subsequently, the photoelectric conversion system 1301 returns to processing in step S1420, and continues the fault detection operation. On the other hand, if the expected output value and the actual output value do not match as a result of the applicability determination in step S1440, the photoelectric conversion system 1301 advances to processing in step S1470. In step S1470, the photoelectric conversion system 1301 determines that the image sensing operation is abnormal, and raises an alarm to the main control unit 1313 or the alarming device 1312. The alarming device 1312 causes the display unit to display a message about the detection of the abnormality. Subsequently, in step S1480, the photoelectric conversion system 1301 stops the photoelectric conversion device 1302, and terminates the operation of the photoelectric conversion system 1301.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-030180, filed Feb. 28, 2022, which is hereby incorporated by reference herein in its entirety.

What is claimed is:

1. A photoelectric conversion device comprising:
a pixel array including a plurality of aperture pixels arranged so as to form a plurality of rows and a plurality of columns;
a plurality of signal lines arranged in the pixel array so as to allow readout of signals from the plurality of aperture pixels;
a plurality of current sources connected to the plurality of signal lines, respectively;
a first voltage supply line configured to supply a first reference voltage to the plurality of aperture pixels;
a first pad connected to the first voltage supply line;
a bias circuit configured to supply a bias voltage to the plurality of current sources;
a second voltage supply line electrically separated from the first voltage supply line, and configured to supply a second reference voltage to the bias circuit; and
a second pad connected to the second voltage supply line,
wherein the pixel array further includes a plurality of light-shielded pixels,
the device further comprises:
a second signal line arranged in the pixel array so as to allow readout of signals from the plurality of light-shielded pixels, and
a third voltage supply line configured to supply the second reference voltage to the plurality of light-shielded pixels, and
the third voltage supply line is connected to the second pad.

2. The device according to claim 1, further comprising a second current source connected to the second signal line,
wherein the second voltage supply line supplies the second reference voltage to the second current source in addition to the plurality of current sources.

3. The device according to claim 2, wherein the pixel array, the plurality of signal lines, the plurality of current sources, the first voltage supply line, the first pad, the second voltage supply line, the second pad, the third voltage supply line, the second signal line, and the second current source are arranged on a semiconductor substrate,
the pixel array has a rectangular outer shape, and the plurality of light-shielded pixels are arranged along, among four sides of the rectangle, a first side parallel to the plurality of columns, and
the second pad is arranged between a second side adjacent to the first side and a side parallel to the second side on the semiconductor substrate.

4. The device according to claim 1, wherein a nominal value of the first reference voltage and a nominal value of the second reference voltage are equal to each other.

5. The device according to claim 1, wherein the pixel array, the plurality of signal lines, the plurality of current sources, the first voltage supply line, the first pad, the second voltage supply line, the second pad, the second signal line, the third voltage supply line, and a third pad are arranged on a semiconductor substrate,
the pixel array has a rectangular outer shape, and the plurality of light-shielded pixels are arranged along, among four sides of the rectangle, a first side parallel to the plurality of columns, and
the second pad is arranged between a virtual straight line including the first side and a side parallel to the virtual straight line on the semiconductor substrate.

6. The device according to claim 5, wherein the third pad is arranged between a second line adjacent to the first side and a side parallel to the second side on the semiconductor substrate.

7. The device according to claim 1, wherein a third pad is connected to the second pad.

8. The device according to claim 1, wherein a nominal value of the first reference voltage, a nominal value of the second reference voltage, and a nominal value of the third reference voltage are equal to each other.

9. The device according to claim 1, wherein a third pad is not connected to the second pad.

10. The device according to claim 9, wherein a nominal value of the first reference voltage and a nominal value of the third reference voltage are equal to each other, and a nominal value of the second reference voltage is different from the nominal value of the first reference voltage and the nominal value of the third reference voltage.

11. The device according to claim 1, further comprising
a second current source connected to the second signal line,
wherein the second voltage supply line supplies the second reference voltage to the second current source in addition to the plurality of current sources.

12. The device according to claim 1, further comprising a plurality of clip circuits configured to limit voltage amplitudes of the plurality of signal lines, respectively.

13. The device according to claim 12, wherein the first reference voltage is supplied to the plurality of clip circuits from the first pad.

14. The device according to claim 1, wherein the bias circuit supplies the bias voltage to the plurality of current sources via a bias line, and
the device further comprises an additional bias circuit, and the additional bias circuit supplies a voltage equal to the bias voltage to the bias line.

15. The device according to claim 14, further comprising a readout circuit configured to read out signals from the pixel array via the plurality of signal lines, and
the additional bias circuit is arranged between the pixel array and the readout circuit.

16. A photoelectric conversion system comprising:
a photoelectric conversion device defined in claim 1; and
a signal processor configured to process a signal output by the photoelectric conversion device.

17. A moving body comprising:
the photoelectric conversion device defined in claim 1, and
a distance information acquirer configured to acquire distance information to a target object from distance measurement information based on a signal from the photoelectric conversion device,
the moving body further comprising a controller configured to control the moving body based on the distance information.

* * * * *